(12) United States Patent
Jerez et al.

(10) Patent No.: US 9,159,526 B1
(45) Date of Patent: Oct. 13, 2015

(54) PLASMA ARC CHAMBER

(71) Applicants: Manuel A. Jerez, Roosevelt, NY (US); Carlos F. M. Borges, Roslyn, NY (US)

(72) Inventors: Manuel A. Jerez, Roosevelt, NY (US); Carlos F. M. Borges, Roslyn, NY (US)

(73) Assignee: ion TECHNOLOGY SOLUTIONS, LLC, Mineola, NY (US)

( * ) Notice: Subject to any disclaimer, the term of this patent is extended or adjusted under 35 U.S.C. 154(b) by 56 days.

(21) Appl. No.: 14/222,147

(22) Filed: Mar. 21, 2014

(51) Int. Cl.
*H01J 17/26* (2012.01)
*H01J 37/04* (2006.01)
*H05H 1/34* (2006.01)

(52) U.S. Cl.
CPC . *H01J 37/04* (2013.01); *H05H 1/34* (2013.01)

(58) Field of Classification Search
CPC .................................. H01J 37/04; H05H 1/34

USPC ......................................... 313/231.31, 231.01
See application file for complete search history.

(56) References Cited

U.S. PATENT DOCUMENTS

| | | | | |
|---|---|---|---|---|
| 5,641,375 | A * | 6/1997 | Nitescu et al. | 156/345.1 |
| 8,253,334 | B2 * | 8/2012 | Jerez | 313/613 |
| 8,658,986 | B1 * | 2/2014 | Jerez et al. | 250/426 |

* cited by examiner

*Primary Examiner* — Vip Patel
(74) *Attorney, Agent, or Firm* — Francis C. Hand; Carella, Byrne, Et Al

(57) ABSTRACT

The plasma arc chamber is made in part of a one piece base fabricated from 95.95% pure tungsten having four rigid walls defining a rectangular central opening. A bottom plate closes the bottom of the base and a cover with a slit for the passage of an ion beam closes the top of the base. Liners are fitted into the bottom plate, the top of base and against the four walls of the base.

10 Claims, 2 Drawing Sheets

PLASMA ARC CHAMBER

This invention relates to a plasma arc chamber and to a method of making a plasma arc chamber. More, particularly, this invention relates to a plasma arc chamber for an ion source assembly. Still more particularly, this invention relates to a plasma arc chamber for an ion source typically used in ion implanters.

As is known, in the manufacture of semi-conductors, ion implanters are widely used to diffuse or implant positive ions onto regions of a semi-conductor wafer. These ion implanters use an ion source that generates an ion beam used to implant the semi-conductor wafers.

Typically, the ion implanters employ an arc chamber to generate the ion beam. In some cases, such as described in U.S. Pat. No. 8,658,986, the arc chamber has been formed, in part, of a one-piece housing of box shape with a pair of openings at one end for a filament. In addition, a removable cover with a liner on the underside is provided on the housing to close the arc chamber and the liner and the cover provided with aligned central slits that function as an arc slit for passage of an ion beam from the arc chamber.

As is known, the one-piece housing of this type of arc chamber can be fabricated by machining a solid block whereby material is removed from the center of the block to create a pocket; the resulting pocket being formed by four surrounding walls and a bottom surface. However, this method of fabrication is limited by the materials that can be used for the block. Typically, porous tungsten is the material that is used for the block. Further, the method of fabrication is time consuming, expensive and the material removed is not useable and is thereby scrapped.

In other cases, it has been known to fabricate an arc chamber of individual plates. In this regard, the arc chamber has a bottom plate and four side wall plates that are interlocked together to define an enclosure along with a removable cover and liner with central slits. However, typical issue that arise with this method of fabrication involve fitting of the plates relative to one another and the potential for movement between the plates causing leakage. Increased part counts also results in increased fabrication costs.

Accordingly, it is an object of the invention to reduce the cost of fabricating an arc chamber.

It is another object of the invention to provide an arc chamber fabricated of 95.95% pure tungsten.

It is another object of the invention to provide an arc chamber with rigid side walls.

It is another object of the invention to fabricate an arc chamber while allowing removed material to be reused.

It is another object of the invention to reduce the amount of waste material generated in the fabrication of an arc chamber.

Briefly, the invention provides an arc plasma chamber that is comprised, in part, of a one piece base having four rigid walls defining a rectangular central opening. This one piece base is fabricated from 95.95% pure tungsten.

In addition, the plasma arc chamber has a bottom plate secured to the four walls of the base to close one end of opening and a cover removably mounted on the four walls of the base to close an opposite end of the opening and having a first slit for passage of an ion beam therethrough. A liner is also provided on an underside of the cover and has a slit in alignment with the slit in the cover for passage of the ion beam therethrough.

The plasma arc chamber also has liners disposed on the walls and bottom plate, as is conventional. That is, the arc plasma chamber has a bottom liner disposed on the bottom plate, a repeller side liner disposed against one end wall, a cathode side liner disposed against an opposite end wall and side liners disposed against the opposite side walls.

These and other objects and advantages of the invention will become more apparent from the following detailed description taken in conjunction with the accompanying drawings wherein.

Figure 1:
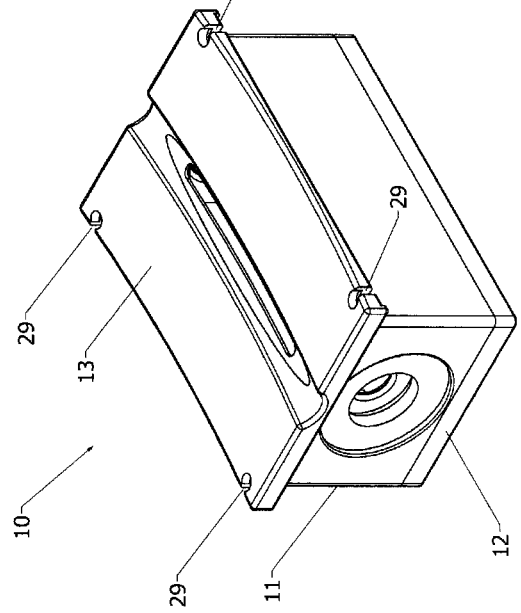
FIG. 1 is a perspective view of a plasma arc chamber constructed in accordance with the invention.

Referring to FIG. 1, the plasma arc chamber 10 has a one piece base 11, a bottom plate 12 and a cover 13.

Figure 2:
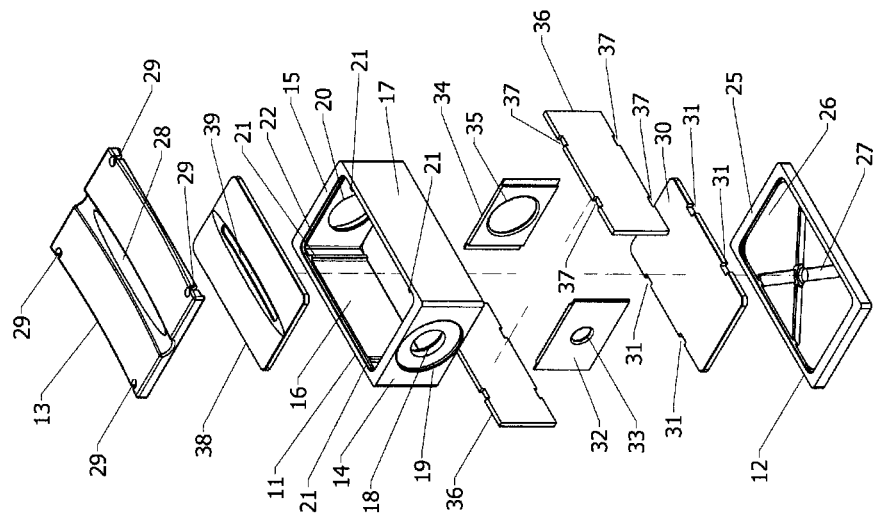
FIG. 2 is an exploded perspective view of the plasma arc chamber of FIG. 1.
Figure 3:
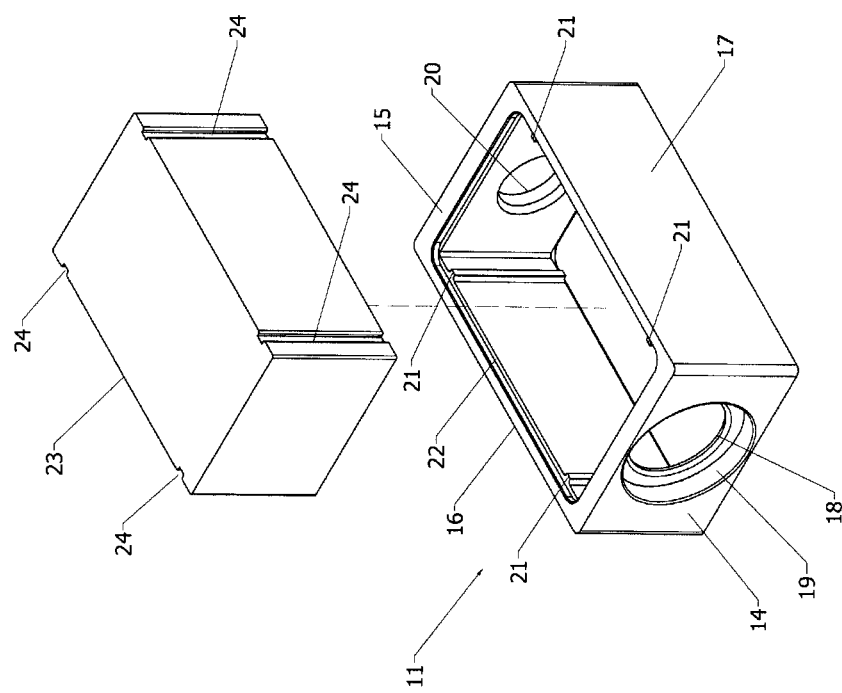
FIG. 3 is a schematic view of the one piece base of the plasma arc chamber of FIG. 1 during fabrication in accordance with the invention.

Referring to FIGS. 2 and 3, the one piece base 11 has four rigid walls 14, 15, 16, 17 defining a rectangular central opening.

As illustrated, one end wall 14 of the base 11 is provided with a circular opening 18 surrounded by a stepped circular recess 19 for mounting of a cathode assembly (not shown) while the opposite end wall 15 is provided with a circular opening 20 for mounting of a repeller assembly (not shown).

In addition, each side wall 16, 17 of the base 11 is provided with a pair of spaced apart parallel ribs 21 that are longitudinally disposed inside the central opening.

A peripheral shoulder 22 is provided about the upper ends, as viewed, of the four walls 14-17.

Referring to FIG. 3, the base 11 is formed from a single block of material, i.e. a block of 95.95% pure tungsten. As illustrated, the block is of rectangular brick-like shape from which a core 23 is removed to form the base 11. In accordance with the method of fabrication of the invention, Electric Discharge Machining (EDM) is used to machine out the core 23. As indicated, the core 23 is of brick-like shape with a pair of parallel grooves 24 on two opposite sides to reflect the formation of the ribs 21 within the base 11.

After removal of the core 23, the end walls 14, 15 are machined to form the openings 18, 20 and stepped recess 19 and the peripheral shoulder 22 is machined into the top of the base 11.

The removed core 23 being made of 95.95% tungsten may be recycled for further use and need not be scrapped.

Referring to FIG. 2, the bottom plate 12 is of rectangular shape and has a peripheral lip 25 for butting against the four walls 14-17 of the base 11 as well as a recess 26 within the peripheral lip 25. The recess 26 includes an X-shaped recess 27 to channel the gas inside the arc chamber whereby the gas is distributed equally within the arc chamber.

The cover 13 is of rectangular shape with a central slit 28 for passage of an ion beam. As indicated, the cover 13 is provided with a notch 29 at each of four corners to receive a mounting bolt (not shown) by which the cover 13 is removably mounted on he base 11 to close the central opening of the base 11. As indicated in FIG. 1, the cover 13 overhangs the base 11 so that the notches 29 are outside the plane of the base 11.

The plasma arc chamber 10 is also provided with six liners to line the chamber.

One liner 30 fits within the recess 26 of the bottom plate 12 and has pairs of notches 31 that receive the ribs 21 on the side walls of the base 11 such that the liner 30 slides on the ribs 21 when being fitted into place in the bottom plate 12.

A cathode side liner 32 fits against the end wall 14 and is sized to extend from the liner 30 to the peripheral shoulder 22. As indicated, this liner 32 has an aperture 33 to be aligned with the opening 18 in the end wall 14. This liner 32 is slid into place by sliding along the ribs 21 of the two adjacent side walls 16, 17 of the base 11.

A repeller side liner 34 fits against the opposite end wall 15 and is sized to extend from the liner 30 to the peripheral shoulder 22. As indicated, this liner 34 has an aperture 35 to be aligned with the opening 20 in the end wall 15. This liner 34 is slid into place by sliding along the ribs 21 of the two adjacent side walls 16, 17 of the base 11.

A pair of side wall liners 36 fit against the respective side walls 16, 17 and each is sized to extend from the liner 30 to the peripheral shoulder 22. In addition, each side liner 36 is sized to extend between the cathode side liner 32 and repeller side liner 34.

Each side liner 36 has pairs of notches 37 at the top edge and the bottom edge which are aligned with the notches 31 in the bottom plate liner 30 for the delivery of gas inside the arc chamber. The side liners 36 rest against the ribs 21 of the side walls 16,17 of the base 11 thereby leaving a gap where the gas can travel to the inside of the arc chamber.

A liner 38 with a central slit 39 fits into the peripheral shoulder 22 in the top of the base 11 in a recessed manner and against the cover 13 with the slit 39 in alignment with the slit 28 of the cover 13.

The liners 30, 32, 34, 36 and 38 fit together without gaps therebetween and present smooth continuous surfaces with the central opening of the base 11.

The bottom plate 12 and cover 13 of the plasma arc chamber 10 may also be made of 95.95% tungsten. Likewise, the several liners 30, 32, 34, 36 and 38 may also be made of 95.95% tungsten.

The invention thus provides an arc chamber that can be fabricated of 95.95% pure tungsten.

The invention also provides a method of fabricating a plasma arc chamber at a reduced cost with rigid side walls while allowing removed material to be reused.

The invention also reduces the amount of waste material generated in the fabrication of an arc chamber.

What is claimed is:

1. A plasma arc chamber comprising
a one piece base having four walls defining a rectangular central opening;
a bottom plate secured to said four walls of said base to close one end of said opening;
a cover removably mounted on said four walls of said base to close an opposite end of said opening and having a first slit for passage of an ion beam therethrough;
a liner on an underside of said cover and having a second slit in alignment with said first slit for passage of the ion beam therethrough.

2. A plasma arc chamber as set forth in claim 1 wherein said base is made of 95.95% pure tungsten.

3. A plasma arc chamber as set forth in claim 1 further comprising a bottom liner disposed on said bottom plate, a repeller side liner disposed against one of said four walls within said opening, a cathode side liner disposed against a second of said four walls opposite said one wall, a first side liner disposed against a third of said walls and a second side liner disposed against a fourth of said walls opposite said third wall.

4. A plasma arc chamber as set forth in claim 1 wherein one end wall of said four walls has a circular opening surrounded by a stepped circular recess and an opposite end wall of said four walls has a circular opening.

5. A plasma arc chamber as set forth in claim 1 wherein each side wall of said four walls has a pair of spaced apart parallel ribs longitudinally disposed inside said central opening.

6. A plasma arc chamber as set forth in claim 1 wherein said base has a peripheral shoulder about the upper ends of said four walls.

7. In a method of fabricating an arc plasma chamber, the steps of
removing a core of brick-like shape with a pair of parallel grooves on two opposite sides from a single block of tungsten to fabricate a one piece base having four rigid walls defining a rectangular central opening and a pair of parallel ribs on two opposite side walls of said four rigid walls; and
machining a first opening in one end wall of said four rigid walls, a second opening surrounded by a stepped recess in a second end wall of said four rigid walls and a peripheral shoulder in the top of said base.

8. The method of claim 7 wherein said block of tungsten is 99.95% pure tungsten.

9. The method of claim 7 further comprising the steps of butting a plate of rectangular shape with a peripheral lip and a recess within said lip against a bottom of said base, fitting a first liner into said recess of said plate, sliding a second liner along a pair of ribs on opposite side walls of said base to fit against said second end wall with an opening aligned with said second opening, sliding a third liner along a pair of ribs on opposite side walls of said base to fit against said one end wall with an opening aligned with said first opening, and fitting a pair of side liners against said ribs on said side walls of said base with each side liner having notches in a top edge thereof and a bottom edge thereof.

10. The method of claim 9 further comprising the steps of fitting a sixth liner with a central slit into said peripheral shoulder of said base and removably mounting a cover of rectangular shape with a central slit on said base and over said sixth liner with said slit thereof in alignment with said slit of said second liner.

* * * * *